(12) United States Patent
Kim et al.

(10) Patent No.: US 11,690,273 B2
(45) Date of Patent: Jun. 27, 2023

(54) PHOTO TRANSISTOR AND DISPLAY DEVICE INCLUDING THE SAME

(71) Applicants: Samsung Display Co., LTD., Yongin-si (KR); Industry-Academic Cooperation Foundation, Yonsei University, Seoul (KR)

(72) Inventors: Tae Sang Kim, Seoul (KR); Hyun Jae Kim, Seoul (KR); Hyuk Joon Yoo, Seoul (KR); Jun Hyung Lim, Seoul (KR)

(73) Assignees: SAMSUNG DISPLAY CO., LTD., Yongin-si (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 138 days.

(21) Appl. No.: 17/115,942

(22) Filed: Dec. 9, 2020

(65) Prior Publication Data
US 2021/0193753 A1 Jun. 24, 2021

(30) Foreign Application Priority Data
Dec. 24, 2019 (KR) ........................ 10-2019-0174429

(51) Int. Cl.
*H10K 59/60* (2023.01)
*H01L 31/032* (2006.01)
(Continued)

(52) U.S. Cl.
CPC .......... *H10K 59/60* (2023.02); *H01L 31/032* (2013.01); *H01L 31/03682* (2013.01);
(Continued)

(58) Field of Classification Search
CPC ............... H01L 27/3227; H01L 27/323; H01L 27/3244; H01L 31/032; H01L 31/03682;
(Continued)

(56) References Cited

U.S. PATENT DOCUMENTS 8,358,167 B2   1/2013  Lan et al.
2012/0146713 A1 * 6/2012  Kim ................. H01L 29/78681
                                                  438/157
(Continued)

FOREIGN PATENT DOCUMENTS

JP    2019009367 A  *  1/2019
KR    2013058405 A  *  6/2013  ............. G06F 3/041
(Continued)

*Primary Examiner* — David Vu
*Assistant Examiner* — Brandon C Fox
(74) *Attorney, Agent, or Firm* — Kile Park Reed & Houtteman PLLC

(57) ABSTRACT

A photo transistor and a display device employing the photo transistor are provided. The photo transistor includes a gate electrode disposed on a substrate, a gate insulating layer that electrically insulates the gate electrode, a first active layer overlapping the gate electrode and including metal oxide, wherein the gate insulating layer is disposed between the gate electrode and the active layer, a second active layer disposed on the first active layer and including selenium, and a source electrode and a drain electrode respectively electrically connected to the second active layer.

16 Claims, 11 Drawing Sheets

(51) Int. Cl.
    *H10K 59/12*      (2023.01)
    *H10K 59/40*      (2023.01)
    *H01L 31/0368*    (2006.01)
    *H01L 31/0376*    (2006.01)
    *H01L 31/113*     (2006.01)
    *H10K 50/844*     (2023.01)
    *G06F 3/041*      (2006.01)
    *H10K 50/11*      (2023.01)

(52) U.S. Cl.
    CPC .... *H01L 31/03762* (2013.01); *H01L 31/1136* (2013.01); *H10K 50/844* (2023.02); *H10K 59/12* (2023.02); *H10K 59/40* (2023.02); *G06F 3/0412* (2013.01); *H10K 50/11* (2023.02)

(58) Field of Classification Search
    CPC .......... H01L 31/03762; H01L 31/1136; H01L 51/5253; H01L 31/0322; H01L 51/5012; Y02E 10/541; H10K 59/60; H10K 50/844; H10K 59/12; H10K 59/40; H10K 50/11
    See application file for complete search history.

(56)        References Cited

U.S. PATENT DOCUMENTS

| | | | |
|---|---|---|---|
| 2012/0327032 A1* | 12/2012 | Jeon | G06F 3/042 |
| | | | 257/E31.085 |
| 2018/0060641 A1* | 3/2018 | Kim | G06V 40/1324 |
| 2019/0278968 A1* | 9/2019 | Yoshii | G06F 3/0421 |
| 2020/0185530 A1* | 6/2020 | Yamazaki | H01L 27/124 |
| 2020/0243620 A1* | 7/2020 | Abe | H01L 51/524 |
| 2020/0310586 A1* | 10/2020 | Ding | H01L 51/5237 |
| 2021/0326554 A1* | 10/2021 | Wang | G06F 3/0421 |

FOREIGN PATENT DOCUMENTS

| | | |
|---|---|---|
| KR | 10-2017-0085962 | 7/2017 |
| KR | 10-1851567 | 4/2018 |
| KR | 10-2019-0057713 | 5/2019 |

\* cited by examiner

PHOTO TRANSISTOR AND DISPLAY DEVICE INCLUDING THE SAME

CROSS-REFERENCE TO RELATED APPLICATION(S)

This application claims priority to and benefits of Korean Patent Application No. 10-2019-0174429 under 35 U.S.C. § 119, filed in the Korean Intellectual Property Office on Dec. 24, 2019, the entire contents of which are incorporated herein by reference.

BACKGROUND

1. Technical Field

The disclosure relates to a photo transistor and a display device including the same.

2. Description of the Related Art

A photo transistor may be a type of optical sensor that may convert light energy into electrical energy. A photo transistor may utilize a photovoltaic effect in which a current flowing according to the intensity of light changes. A photo transistor has an advantage of being more sensitive to light than a photo diode because a photo transistor can amplify the photocurrent using a transistor.

Since an oxide semiconductor may have various advantages over amorphous silicon, such as high mobility, transparency, and a low temperature process, efforts have recently been made to utilize an oxide semiconductor for a photo transistor.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure may provide a photo transistor capable of improving a light absorption rate in a visible wavelength band.

Aspects of the disclosure may also provide a display device including a photo transistor as an optical sensor.

However, aspects of the disclosure are not restricted to those set forth herein. The above and other aspects of the disclosure will become more apparent to one of ordinary skill in the art to which the disclosure pertains by referencing the detailed description of the disclosure given below.

A photo transistor according to an embodiment may include a second active layer including selenium in addition to the first active layer including metal oxide, thereby absorbing light (e.g., all light) in the visible wavelength band. Thus, it may be possible to improve light sensing characteristics. Further, it may be possible to improve the photoresponsibity, photosensitivity and detectivity of the photo transistor.

A display device according to an embodiment may include a photo transistor having excellent characteristics, thereby improving the light sensing characteristics of the display device.

The effects of the disclosure are not limited to the aforementioned effects, and various other effects are included in the specification.

In an embodiment, a photo transistor may include a gate electrode disposed on a substrate, a gate insulating layer that electrically insulates the gate electrode, a first active layer overlapping the gate electrode and including metal oxide, wherein the gate insulating layer may be disposed between the gate electrode and the first active layer, a second active layer disposed on the first active layer and including selenium, and a source electrode and a drain electrode respectively electrically connected to the second active layer.

In an embodiment, the first active layer and the second active layer may be in contact with each other in a region in which the first active layer and the second active layer overlap the gate electrode.

In an embodiment, the first active layer may be disposed closer to the gate electrode than the second active layer.

In an embodiment, the source electrode may cover a portion of the second active layer, and the drain electrode may cover another portion of the second active layer.

In an embodiment, a side edge of the first active layer and a side edge of the second active layer may be in contact with each other and aligned with each other.

In an embodiment, the source electrode and the drain electrode may be disposed between the first active layer and the second active layer.

In an embodiment, the first active layer may include at least one selected from an oxide semiconductor, amorphous silicon, polycrystalline silicon, and a two-dimensional (2D) material.

In an embodiment, the oxide semiconductor may include a compound having at least one selected from the group consisting of indium (In), zinc (Zn), gallium (Ga), tin (Sn), titanium (Ti), aluminum (Al), hafnium (Hf), zirconium (Zr) and magnesium (Mg), and the 2D material may include graphene or MoS.

In an embodiment, the second active layer includes may include a compound having at least one of copper (Cu), indium (In), and gallium (Ga).

In an embodiment, the second active layer may have a thickness of about 5 nm to about 300 nm.

In an embodiment, a display device may include a substrate including a transmissive region and a light emission region, a transistor layer disposed on the substrate and including a first transistor and a second transistor, a light emitting element layer disposed on the transistor layer and including a first electrode, and a touch sensor disposed on the light emitting element layer and including electrodes. The first transistor may include a gate electrode, a first active layer including metal oxide, a second active layer including selenium, and source and drain electrodes.

In an embodiment, the first transistor may overlap the transmissive region of the substrate, and the second transistor may overlap the light emission region of the substrate.

In an embodiment, the first transistor may not overlap the first electrode of the light emitting element layer and may not overlap the electrodes of the touch sensor.

In an embodiment, the second transistor may overlap the first electrode of the light emitting element layer and may not overlap the electrodes of the touch sensor.

In an embodiment, the light emitting element layer may further include a second electrode facing the first electrode, and an organic light emitting layer disposed between the first electrode and the second electrode. The first transistor and the second transistor may overlap the second electrode.

In an embodiment, the display device may further include a thin film encapsulation layer disposed between the light emitting element layer and the touch sensor.

In an embodiment, the electrodes of the touch sensor include driving electrodes and sensing electrodes.

In an embodiment, the first active layer and the second active layer may be in contact with each other in a region in which the first active layer and the second active layer overlap the gate electrode.

In an embodiment, the first active layer may be disposed closer to the gate electrode than the second active layer.

In an embodiment, the second active layer may include a compound having at least one of copper (Cu), indium (In), and gallium (Ga).

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
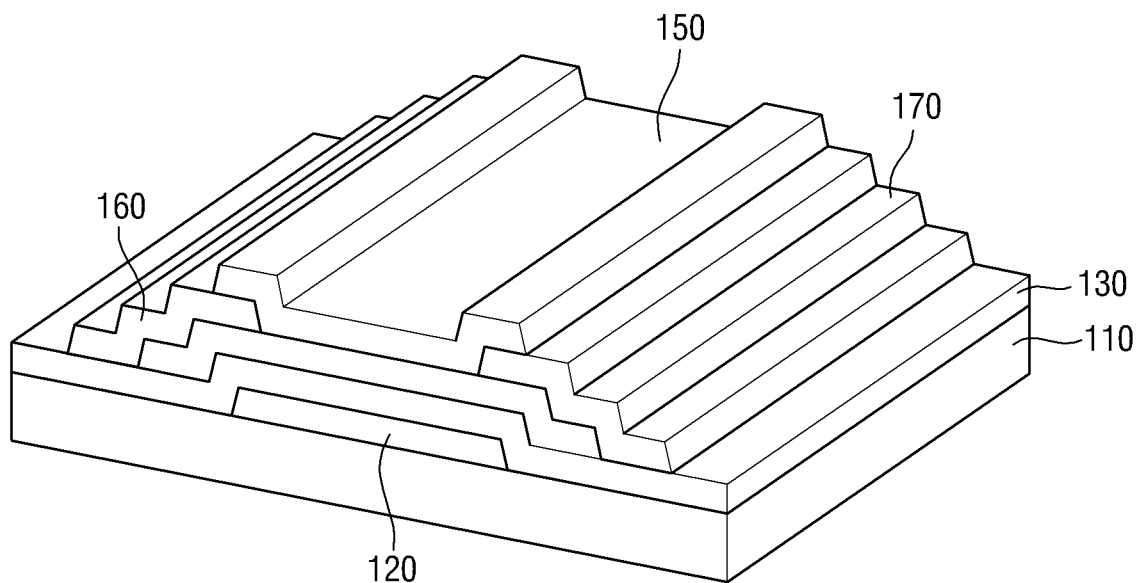
FIG. 1 is a schematic perspective view illustrating a photo transistor according to an embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

As used herein, the singular forms "a," "an," and "the" are intended to include the plural forms as well, unless the context clearly indicates otherwise.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will also be understood that when a layer is referred to as being "on" another layer or substrate, it can be directly on the other layer or substrate, or intervening layers may also be present. The same reference numbers indicate the same components throughout the specification.

The term "overlap" may include "layer," "stack," "face" or "facing," "extending over," "covering" or "partly covering," or any other suitable term as would be appreciated and understood by those of ordinary skill in the art. The phrase "not overlap" may include "apart from" or "set aside from" or "offset from" and any other suitable equivalents as would be appreciated and understood by those of ordinary skill in the art.

When an element is referred to as being "in contact" or "contacted" or the like to another element, the element may be in "electrical contact" and/or in "physical contact" with another element. Further the element may be in "indirect contact" or in "direct contact" with another element.

The phrase "at least one of" is intended to include the meaning of "at least one selected from the group of" for the purpose of its meaning and interpretation. For example, "at least one of A and B" may be understood to mean "A, B, or A and B."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments of the disclosure will be described in detail with reference to the accompanying drawings.

Figure 2:
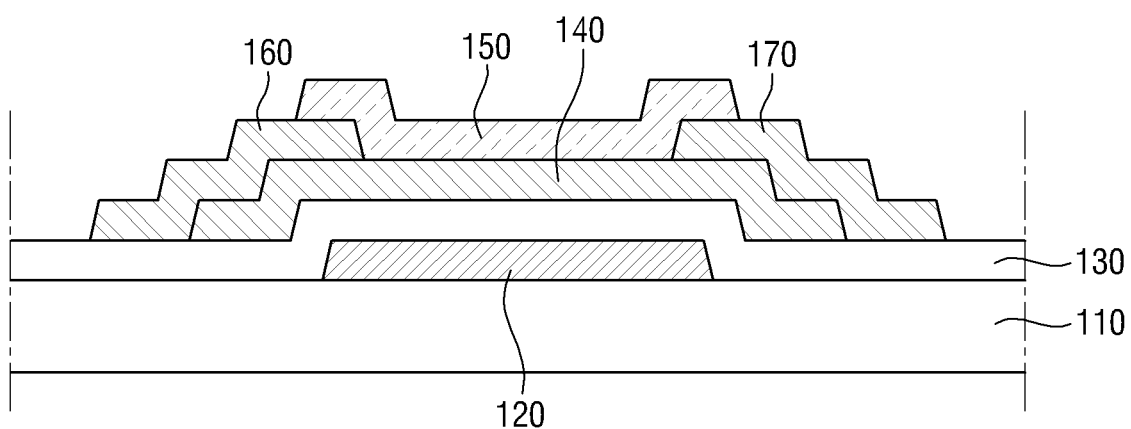
FIG. 2 is a schematic cross-sectional view illustrating a photo transistor according to an embodiment.

FIG. 1 is a schematic perspective view illustrating a photo transistor according to an embodiment. FIG. 2 is a schematic cross-sectional view illustrating a photo transistor according to an embodiment.

Referring to FIGS. 1 and 2, a photo transistor 1 according to an embodiment may be included in devices that can be applied as optical sensors. For example, the photo transistor 1 may be applied to a smartphone, a mobile phone, a tablet PC, a personal digital assistant (PDA), a portable multimedia player (PMP), a television, a game machine, a wristwatch-type electronic device, a head-mounted display, a monitor of a personal computer, a laptop computer, a car navigation system, a car's dashboard, a digital camera, a camcorder, an external billboard, an electronic billboard, a medical device, an inspection device, various household appliances such as a refrigerator and a washing machine, and the like.

The photo transistor 1 may serve to sense ambient light and may play various roles through light sensing. For example, in a case where the photo transistor 1 may be applied to a smartphone using an organic light emitting display device, by using the photo transistor as a light sensor, the luminance of the organic light emitting display device may be increased if the luminance of ambient light is high. The luminance of the organic light emitting display device may be decreased if the luminance of ambient light is low. Accordingly, visibility may be improved and power consumption may be reduced.

The photo transistor 1 according to an embodiment may include a gate electrode 120, a first active layer 140, a second active layer 150, a source electrode 160 and a drain electrode 170 disposed on a substrate 110.

The substrate 110 may be an insulating substrate. The substrate 110 may include a transparent material. For example, the substrate 110 may include a transparent insulating material such as glass, polymeric material, quartz, or the like, or a combination thereof. For example, the polymeric material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate 110 may be a rigid substrate. However, the substrate 110 is not limited thereto, and may have a flexible property such that it can be bent, folded, or rolled. Further, the substrate 110 may include a metal material.

The gate electrode 120 may be disposed on the substrate 110. The gate electrode 120 may be formed of a single layer or multiple layers. In case that the gate electrode 120 is a single layer, it may include any one selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W) and copper (Cu), or an alloy thereof. In case that the gate electrode 120 is a multilayer, it may be a multilayer made of the aforementioned materials. For example, the gate electrode 120 may be two layers of molybdenum/aluminum-neodymium, molybdenum/aluminum or copper/titanium.

A gate insulating layer 130 covering the gate electrode 120 may be disposed on the gate electrode 120. The gate insulating layer 130 may include a silicon compound, metal oxide, or the like, or a combination thereof. For example, the gate insulating layer 130 may include silicon oxide, silicon nitride, silicon oxynitride, aluminum oxide, tantalum oxide, hafnium oxide, zirconium oxide, titanium oxide, or the like, or a combination thereof. In an embodiment, the gate insulating layer 130 may include a SiOx layer.

The first active layer 140 overlapping the gate electrode 120 may be disposed on the gate insulating layer 130. The first active layer 140 may have semiconductor characteristics to act as a substantial channel layer of the transistor. The first active layer 140 may be a light absorbing layer capable of absorbing visible light in a specific wavelength band. The first active layer 140 may include an oxide semiconductor, amorphous silicon, polycrystalline silicon, or a two-dimensional (2D) material such as graphene or MoS, or a combination thereof. The oxide semiconductor may include, for example, a binary compound (ABx), a ternary compound (ABxCy), or a quaternary compound (ABxCyDz) including indium (In), zinc (Zn), gallium (Ga), tin (Sn), titanium (Ti), aluminum (Al), hafnium (Hf), zirconium (Zr), magnesium (Mg) and the like, or a combination thereof. In an embodiment, the first active layer 140 may include indium tin zinc oxide (IGZO).

The second active layer 150 may be disposed on the first active layer 140. The second active layer 150 may be a layer having a higher photosensitivity than the first active layer 140. The photosensitivity may increase as the energy band gap decreases. Therefore, the second active layer 150 may have a higher photosensitivity and a smaller energy band gap than the first active layer 140. The second active layer 150 may be a light absorbing layer capable of absorbing light in a visible wavelength band. For example, the second active layer 150 may be a light absorbing layer capable of absorbing light in a long wavelength band. The light in a long wavelength band may be light in red and green wavelength bands. The second active layer 150 may be disposed on (e.g., directly on) the first active layer 140 and may cover at least a portion of an upper portion of the first active layer 140. The second active layer 150 may overlap the gate electrode 120 in a same or similar manner as the first active layer 140.

The second active layer 150 may include at least selenium (Se). For example, the second active layer 150 may include selenium or a compound having selenium. Selenium may be amorphous selenium or crystalline selenium. For example, the compound having selenium may include a binary compound (ABx), a ternary compound (ABxCy), or a quaternary compound (ABxCyDz) containing copper (Cu), indium (In), gallium (Ga), or the like, or a combination thereof. In an embodiment, a single layer of selenium is described as an example.

The second active layer 150 may have a thickness of about 5 nm to about 300 nm. In case that the second active layer 150 has a thickness of about 5 nm or more, it may be possible to prevent the photo transistor from failing to exhibit its characteristics because the amount of electrons passing to the first active layer 140 beyond the band gap of the second active layer 150 may be small. In case that the second active layer 150 has a thickness of about 300 nm or less, it may be possible to prevent an off current of the photo transistor from increasing.

The source electrode 160 and the drain electrode 170 may be disposed between the first active layer 140 and the second active layer 150. Specifically, the source electrode 160 may be disposed on a side of the first active layer 140 to cover a side of the first active layer 140 and be disposed below a side of the second active layer 150. The drain electrode 170 may be disposed on another side of the first active layer 140 to cover a side of the first active layer 140 and be disposed below a side of the second active layer 150.

The source electrode 160 and the drain electrode 170 may be formed of a single layer or multiple layers. In case that the source electrode 160 and the drain electrode 170 are formed of a single layer, it may include any one selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W) and copper (Cu), or an alloy thereof. In case that the source electrode 160 and the drain electrode 170 are formed of a multilayer, it may consist of two layers of copper/titanium or molybdenum/aluminum-neodymium, three layers titanium/aluminum/titanium, molybdenum/aluminum/molybdenum or molybdenum/aluminum-neodymium/molybdenum.

In the phototransistor 1 according to the above-described embodiment, the first active layer 140 may act as a channel layer of the transistor, and may absorb light in a short wavelength band, e.g., a blue wavelength band. The second active layer 150 may absorb light in a visible wavelength band, e.g., red, green and blue wavelength bands. Therefore, by forming the first active layer 140 and the second active layer 150 to absorb the light (e.g., entire light) in the visible wavelength band, it may be possible to improve light sensing characteristics.

Figure 3:
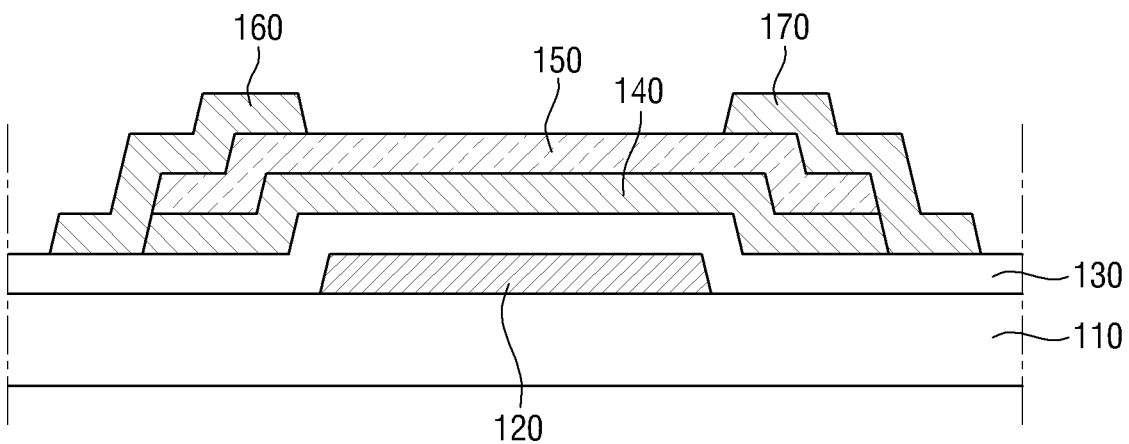
FIG. 3 is a schematic cross-sectional view illustrating a photo transistor according to another embodiment.

FIG. 3 is a cross-sectional view illustrating a photo transistor according to another embodiment. In FIG. 3, there is a difference in the stack structure of the second active layer, the source electrode and the drain electrode as compared with the embodiment described with reference to FIG. 2. In the following description, a description of same or similar components as those of FIG. 2 will be simplified or omitted, and a description will be given of different components.

Referring to FIG. 3, the second active layer 150 may be disposed on the first active layer 140. The first active layer 140 and the second active layer 150 may be formed in a same or similar pattern shape. For example, the side edges of the first active layer 140 may be aligned with the side edges of the second active layer 150. Here, "may be aligned" may mean that the side edges of the first active layer 140 and the side edges of the second active layer 150 extend continuously in contact (e.g., physical contact) with each other.

The source electrode 160 and the drain electrode 170 may be disposed on the second active layer 150. Specifically, the source electrode 160 may be disposed on a side of the second active layer 150 to cover a side of the second active layer 150 and may be disposed in contact with a side of the first active layer 140. The drain electrode 170 may be disposed on another side of the second active layer 150 to cover a side of the second active layer 150 and may be disposed in contact with a side of the first active layer 140.

The difference in structure between the first active layer 140, the second active layer 150, the source electrode 160 and the drain electrode 170 described above with reference to FIGS. 2 and 3 may be described as a difference in the manufacturing process described below.

FIGS. 4 to 8 are schematic cross-sectional views for describing a method of manufacturing the photo transistor of FIG. 2 according to an embodiment.

Figure 4:
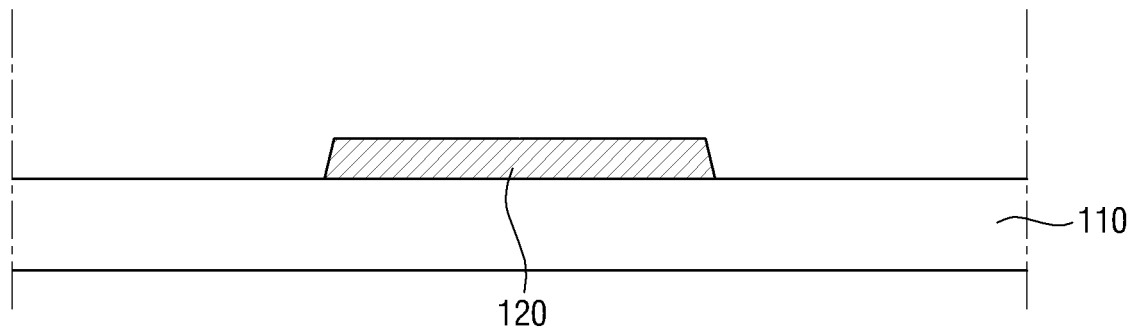
FIGS. 4 to 8 are schematic cross-sectional views for describing a method of manufacturing the photo transistor of FIG. 2 according to an embodiment.

Referring to FIG. 4, a gate electrode (e.g., patterned gate electrode) 120 may be formed on the substrate 110. The patterned gate electrode 120 may be formed by a mask process. For example, after depositing a material layer for a gate electrode on the surface (e.g., entire surface) of the substrate 110, the gate electrode 120 may be formed as shown in FIG. 4 by patterning through a photolithography process.

Figure 5:
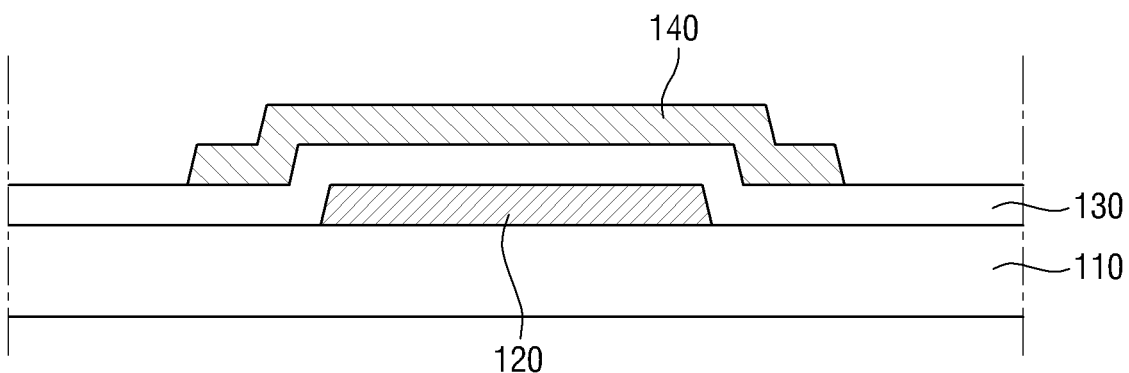

Referring to FIG. 5, the gate insulating layer 130 may be formed on the surface (e.g., entire surface) of the substrate 110 on which the gate electrode 120 may be formed. The first active layer 140 may be formed on the gate insulating layer 130. The first active layer 140 may be formed by a mask process. For example, a material layer for a first active layer may be deposited (e.g., entirely deposited) on the gate insulating layer 130, and patterned through a photolithography process to form the first active layer 140 as illustrated in FIG. 5.

Figure 6:
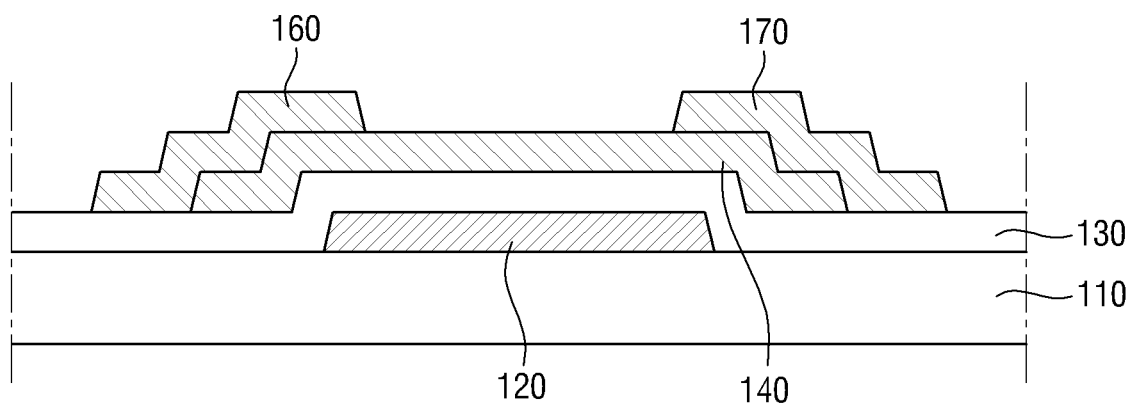

Referring to FIG. 6, a patterned source electrode 160 and a patterned drain electrode 170 may be formed on the gate insulating layer 130 on which the first active layer 140 may be formed. The patterned source electrode 160 and the patterned drain electrode 170 may be formed by a mask process. For example, after depositing (e.g., entirely depositing) an electrode material layer on the gate insulating layer 130 on which the first active layer 140 may be formed, patterning may be performed through a photolithography process to form the source electrode 160 and the drain electrode 170 as shown in FIG. 6.

Figure 7:
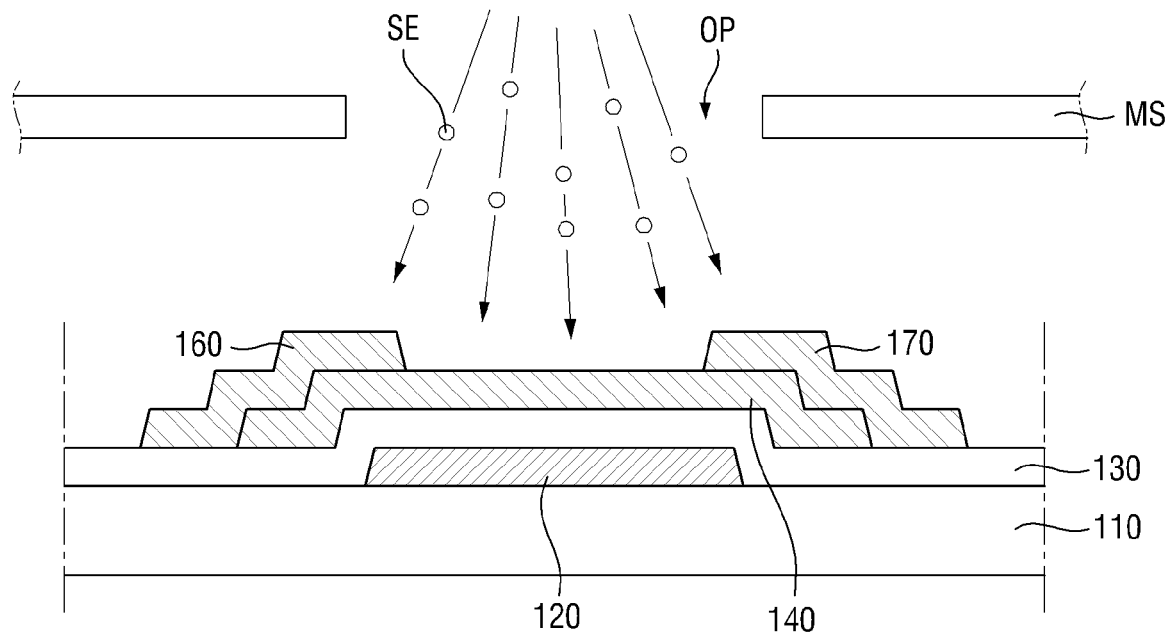
Figure 8:
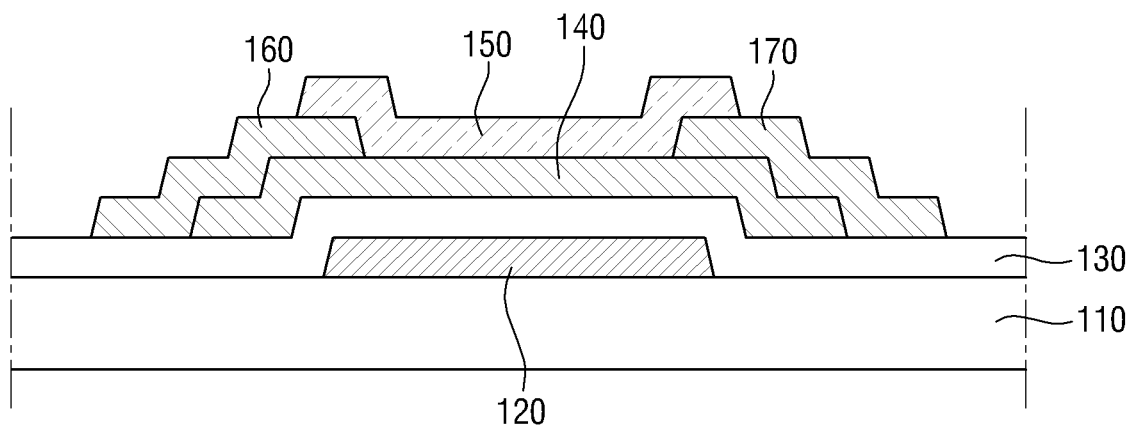

Referring to FIG. 7, the second active layer 150 may be formed on the substrate 110 on which the source electrode 160 and the drain electrode 170 may be formed. The second active layer 150 may be formed by a deposition process using a shadow mask. For example, a shadow mask MS may be aligned relative to the substrate 110. The shadow mask MS may include an opening OP corresponding to a region in which the second active layer 150 is to be formed. An active material (e.g., selenium (Se)) may be deposited on the substrate 110 through the shadow mask MS using physical vapor deposition (PVD) such as thermal evaporation, e-beam evaporation, sputtering and the like. The deposited active material may be deposited in a region (e.g., only in a region) corresponding to the opening OP through the opening OP of the shadow mask MS, thereby forming the second active layer 150 without performing a separate patterning process. Since physical vapor deposition may be performed at a low temperature, the photo transistor may be manufactured at a low temperature and applied to various devices requiring a low temperature process. Accordingly, the second active layer 150 as shown in FIG. 8 may be formed.

Figure 9:
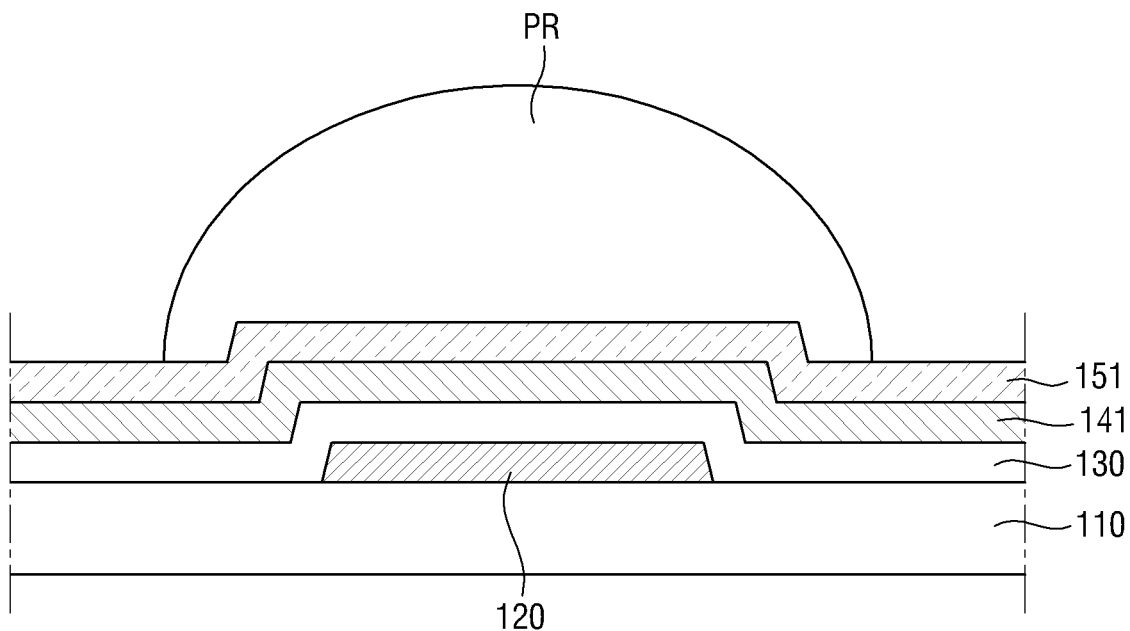
FIGS. 9 to 11 are schematic cross-sectional views for describing a method of manufacturing the photo transistor of FIG. 3 according to an embodiment.
Figure 10:
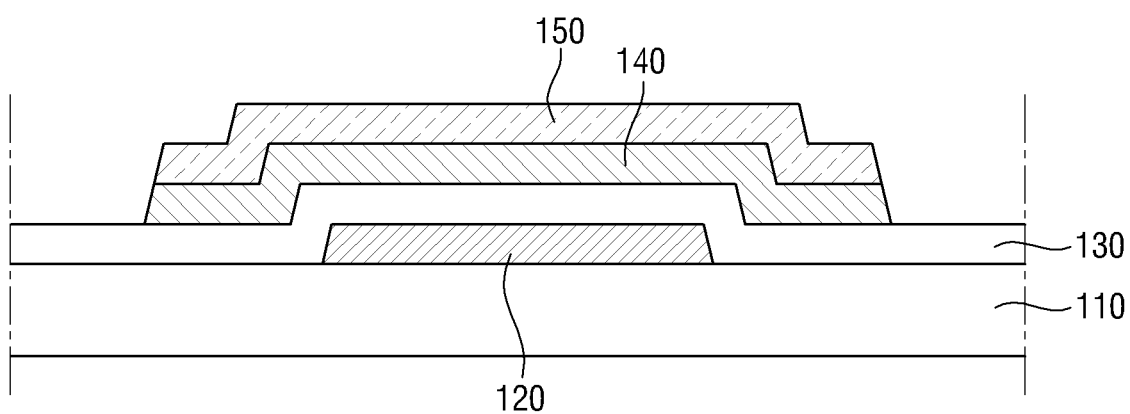
Figure 11:
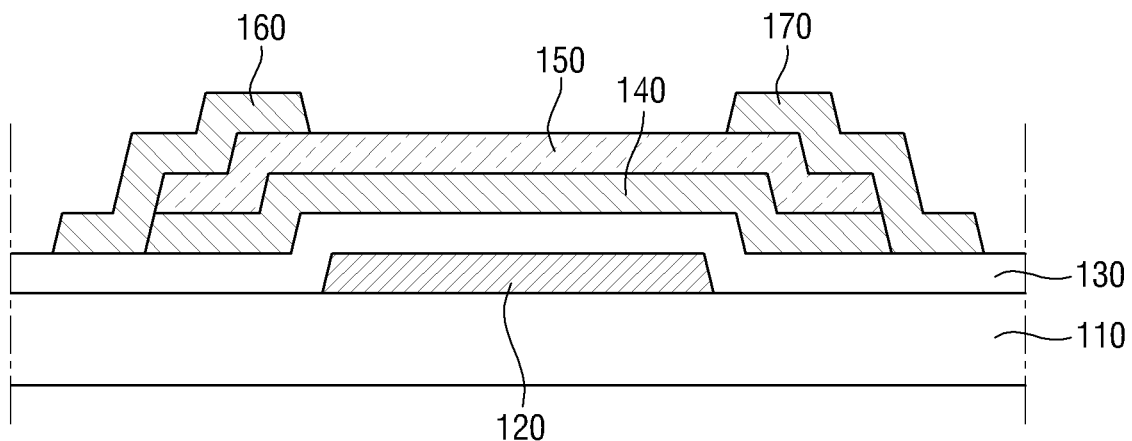

FIGS. 9 to 11 are schematic cross-sectional views for describing a method of manufacturing the photo transistor of FIG. 3 according to an embodiment. In the following description, a description of same or similar components as those of the above-described embodiment will be omitted or simplified to avoid redundancy, and differences will be described.

Referring to FIG. 9, a process until the formation of the patterned gate electrode 120 and the gate insulating layer 130 on the substrate 110 may be the same as or similar to the embodiment of FIGS. 4 and 5. A material layer 141 for the first active layer and a material layer 151 for the second active layer may be sequentially stacked on the surface (e.g., entire surface) of the substrate 110 on which the gate insulating layer 130 may be formed. A photoresist layer may be coated on the material layer 151 for the second active layer, and a photoresist pattern PR may be formed through exposure and development. The photoresist pattern PR may be overlappingly disposed on a region where the first active layer 140 and the second active layer 150 are to be formed.

Referring to FIG. 10, the material layer 141 for the first active layer and the material layer 151 for the second active layer may be sequentially etched using the photoresist pattern PR as an etching mask. Thereafter, the photoresist pattern PR may be removed by a strip or ashing process, thereby forming the first active layer 140 and the second active layer 150 sequentially stacked on the gate insulating layer 130. In an embodiment, a case where the photoresist pattern PR may be used as an etching mask until the patterning of the first active layer 140 and the second active layer 150 has been illustrated as an example. However, a patterned upper layer may be used as a hard mask for etching a lower layer. In addition to the hard mask, the photoresist pattern may be used as an etching mask together with the hard mask. As another example, after forming the hard mask, the photoresist pattern may be removed, and the lower layer may be etched using the hard mask as an etching mask.

Through the above-described process, the first active layer 140 and the second active layer 150 may be formed in a same or similar pattern shape. For example, side edges of the first active layer 140 may be aligned with side edges of the second active layer 150. For example, side edges of the first active layer 140 and side edges of the second active layer 150 may extend in contact with each other.

Referring to FIG. 11, the patterned source electrode 160 and the patterned drain electrode 170 may be formed on the gate insulating layer 130 on which the second active layer 150 may be formed. The patterned source electrode 160 and the patterned drain electrode 170 may be formed by a mask process. For example, after depositing (e.g., entirely depositing) an electrode material layer on the gate insulating layer 130 on which the second active layer 150 may be formed, patterning may be performed through a photolithography process to form the source electrode 160 and the drain electrode 170 as shown in FIG. 11.

The photo transistor according to the embodiments described above may serve as an optical sensor capable of absorbing most of the light in the visible wavelength band by forming the first active layer including metal oxide and the second active layer including selenium.

Figure 12:
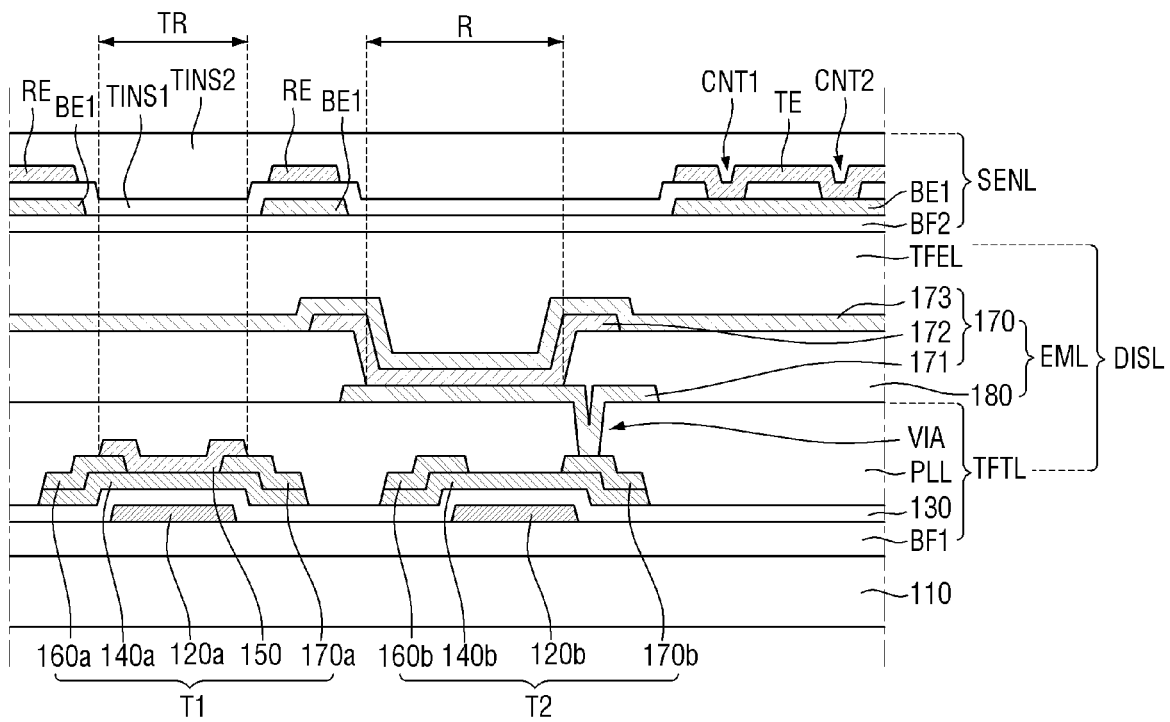
FIG. 12 is a schematic cross-sectional view of a display device having a touch sensor according to an embodiment.

Hereinafter, a display device including the photo transistor according to an embodiment will be described with reference to FIG. 12. In FIG. 12, an organic light emitting display device having a touch sensor embedded therein is illustrated as an example, and a cross-sectional view of a pixel of the organic light emitting display device is illustrated to describe an example of applying the above-described photo transistor.

FIG. 12 is a schematic cross-sectional view of a display device having a touch sensor embedded therein according to an embodiment.

Referring to FIG. 12, a display part DISL including a first buffer layer BF1, a thin film transistor layer TFTL, a light emitting element layer EML, and a thin film encapsulation layer TFEL may be formed on the substrate 110. The thin film transistor layer TFTL may include thin film transistors T1 and T2, the gate insulating layer 130, and a planarization layer PLL.

The first buffer layer BF1 may be disposed on one surface of the substrate 110. The first buffer layer BF1 may be formed to protect the thin film transistors T1 and T2 and an organic light emitting layer 172 of the light emitting element layer EML from moisture permeation or impurities of the substrate 110. The first buffer layer BF1 may be formed of inorganic layers that may be alternately stacked on each other. For example, the first buffer layer BF1 may be formed of multiple layers in which one or more inorganic layers of a silicon nitride layer, a silicon oxynitride layer, a silicon oxide layer, a titanium oxide layer and an aluminum oxide layer may be alternately stacked on each other. The first buffer layer BF1 may be omitted.

The thin film transistor layer TFTL including the thin film transistors T1 and T2 may be disposed on the first buffer layer BF1. The thin film transistors may include a first transistor T1 and a second transistor T2. The first transistor T1 may be a photo transistor according to the above-described embodiments, and the second transistor T2 may be a driving transistor for driving the light emitting element layer EML.

The first transistor T1 may include a first gate electrode 120a, a first active layer 140a, a second active layer 150, a first source electrode 160a, and a first drain electrode 170a. The second transistor T2 may include a second gate electrode 120b, a third active layer 140b, a second source electrode 160b, and a second drain electrode 170b.

Specifically, the first gate electrode 120a and the second gate electrode 120b may be disposed on the first buffer layer BF1. The first gate electrode 120a and the second gate electrode 120b may be patterned and spaced apart from each other.

The gate insulating layer 130 may be disposed on the substrate 110 on which the first gate electrode 120a and the second gate electrode 120b may be disposed. In FIG. 12, a case where the gate insulating layer 130 may also be formed in a region other than a region overlapping the first gate electrode 120a and the second gate electrode 120b has been illustrated, but the disclosure is not limited thereto. For example, the gate insulating layer 130 may be formed only in the region overlapping the first gate electrode 120a and the second gate electrode 120b.

The first active layer 140a and the third active layer 140b may be disposed on the gate insulating layer 130. The first active layer 140a may be disposed to overlap the first gate electrode 120a, and the third active layer 140b may be disposed to overlap the second gate electrode 120b. The first active layer 140a and the third active layer 140b may include an oxide semiconductor. For example, the oxide semiconductor may include a binary compound (ABx), a ternary compound (ABxCy), or a quaternary compound (ABxCyDz) including indium, zinc, gallium, tin, titanium, aluminum, hafnium (Hf), zirconium (Zr), magnesium (Mg) and the like, or a combination thereof. For example, the first active layer 140a and the second active layer 140b may include IGZO (an oxide including indium, gallium, and tin).

The first source electrode 160a and the first drain electrode 170a may be disposed on the first active layer 140a. The second source electrode 160b and the second drain electrode 170b may be disposed on the third active layer 140b. The second active layer 150 may be disposed on the first active layer 140a, the first source electrode 160a, and the first drain electrode 170a. Accordingly, the first transistor T1 may include the first gate electrode 120a, the first active layer 140a, the second active layer 150, the first source electrode 160a, and the first drain electrode 170a. The second transistor T2 may include the second gate electrode 120a, the third active layer 140b, the second source electrode 160b, and the second drain electrode 170b.

The planarization layer PLL may be disposed on the substrate 110 on which the first transistor T1 and the second transistor T2 may be disposed to planarize a level difference caused by the transistors T1 and T2. The planarization layer PLL may be formed of an organic layer such as acryl resin, epoxy resin, phenolic resin, polyamide resin, polyimide resin and the like, or a combination thereof.

The light emitting element layer EML may be disposed on the thin film transistor layer TFTL. The light emitting element layer EML may include light emitting elements 175 and a pixel defining layer 180. The light emitting elements 175 and the pixel defining layer 180 may be disposed on the planarization layer PLL. Each of the light emitting elements 175 may include a first electrode 171, an organic light emitting layer 172, and a second electrode 173.

The first electrode 171 may be disposed on the planarization layer PLL and may be a pixel electrode. In FIG. 12, a case where the first electrode 171 may be electrically connected to the second drain electrode 170b of the second transistor T2 through a via hole VIA passing through the planarization layer PLL has been illustrated as an example, but the disclosure is not limited thereto. As another example, the first electrode 171 may be electrically connected to the second source electrode 160b of the second transistor T2 through the via hole VIA passing through the planarization layer PLL.

In a top emission structure in which light may be emitted toward the second electrode 173 viewed with respect to the organic light emitting layer 172, the first electrode 171 may include a metal material having a high reflectivity to have, e.g., a stacked structure (Ti/Al/Ti) of aluminum and titanium, a stacked structure (ITO/Al/ITO) of aluminum and ITO, an APC alloy, and a stacked structure (ITO/APC/ITO)

of an APC alloy and ITO. The APC alloy may be an alloy of silver (Ag), palladium (Pd) and copper (Cu). In another example, the first electrode 171 may be formed of a single layer of molybdenum (Mo), titanium (Ti), copper (Cu), or aluminum (Al), or a combination thereof.

In a bottom emission structure in which light may be emitted toward the first electrode 171 viewed with respect to the organic light emitting layer 172, the first electrode 171 may include a transparent conductive material (TCO) such as ITO or IZO capable of transmitting light, or a semi-transmissive conductive material such as magnesium (Mg), silver (Ag), or an alloy of magnesium (Mg) and silver (Ag), or a combination thereof. In case that the first electrode 171 may be formed of a semi-transmissive metal material, the light emission efficiency can be increased due to a micro-cavity effect.

The pixel defining layer 180 may be disposed to partition the first electrode 171 on the planarization layer PLL to serve as a pixel defining layer defining a light emission region R. The pixel defining layer 180 may cover an edge of the first electrode 171. The pixel defining layer 180 may include an organic layer such as acryl resin, epoxy resin, phenolic resin, polyamide resin, polyimide resin and the like, or a combination thereof.

The light emission region R may refer to a region where the first electrode 171, the organic light emitting layer 172 and the second electrode 173 may be stacked sequentially and holes from the first electrode 171 and electrons from the second electrode 173 may be coupled to each other in the organic light emitting layer 172 to emit light.

The organic light emitting layer 172 may be disposed on the first electrode 171 and the pixel defining layer 180. The organic light emitting layer 172 may include an organic material to emit light in a color. For example, the organic light emitting layer 172 may include a hole transporting layer, an organic material layer, and an electron transporting layer. In another example, the organic light emitting layers 172 of the light emission region R may be formed as one layer to emit white light, ultraviolet light, or blue light.

The second electrode 173 may be disposed on the organic light emitting layer 172. The second electrode 173 may cover the organic light emitting layer 172. The second electrode 173 may be a common layer formed commonly to the pixels. In the top emission structure, the second electrode 173 may include a transparent conductive material (TCO) such as ITO or IZO capable of transmitting light or a semi-transmissive conductive material such as magnesium (Mg), silver (Ag), or an alloy of magnesium (Mg) and silver (Ag). In case that the second electrode 173 may be formed of a semi-transmissive metal material, the light emission efficiency can be increased due to a micro-cavity effect.

In the bottom emission structure, the second electrode 173 may be formed of a metal material, having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. The APC alloy may be an alloy of silver (Ag), palladium (Pd) and copper (Cu). In another example, the second electrode 173 may be formed of a single layer of molybdenum (Mo), titanium (Ti), copper (Cu), aluminum (Al), or ITO, or a combination thereof.

The thin film encapsulation layer TFEL may be disposed on the light emitting element layer EML. The thin film encapsulation layer TFEL may be disposed on the second electrode 173. The thin film encapsulation layer TFEL may include at least one inorganic layer to prevent oxygen or moisture from penetrating into the organic light emitting layer 172 and the second electrode 173. The thin film encapsulation layer TFEL may include at least one organic layer to protect the light emitting element layer EML from foreign substances such as dust. For example, the thin film encapsulation layer TFEL may include a first inorganic layer disposed on the second electrode 173, an organic layer disposed on the first inorganic layer, and a second inorganic layer disposed on the organic layer. The first inorganic layer and the second inorganic layer may be formed of a silicon nitride layer, a silicon oxynitride layer, a silicon oxide layer, a titanium oxide layer, an aluminum oxide layer, or a combination thereof, but are not limited thereto. The organic layer may include acryl resin, epoxy resin, phenolic resin, polyamide resin, polyimide resin, or the like, or a combination thereof, but is not limited thereto.

A touch sensor SENL may be disposed on the thin film encapsulation layer TFEL. The touch sensor SENL may include driving electrodes TE, sensing electrodes RE, and connection parts BE1.

A second buffer layer BF2 may be disposed on the thin film encapsulation layer TFEL. The second buffer layer BF2 may be formed of multiple layers in which one or more inorganic layers of a silicon nitride layer, a silicon oxynitride layer, a silicon oxide layer, a titanium oxide layer and an aluminum oxide layer may be alternately stacked on each other.

The connection parts BE1 may be disposed on the second buffer layer BF2. The connection parts BE1 may be formed to have, e.g., a stacked structure (Ti/Al/Ti) of aluminum (Al) and titanium (Ti), a stacked structure (ITO/Al/ITO) of Al and ITO, an APC alloy, or a stacked structure (ITO/APC/ITO) of an APC alloy and ITO, but are not limited thereto. For example, the connection parts BE1 may be formed of a single layer of molybdenum (Mo), titanium (Ti), copper (Cu), aluminum (Al), or ITO, or a combination thereof.

A first sensing insulating layer TINS1 may be disposed on the connection parts BE1. The first sensing insulating layer TINS1 may be formed of an inorganic layer, for example, a silicon nitride layer, a silicon oxynitride layer, a silicon oxide layer, a titanium oxide layer, or an aluminum oxide layer, or a combination thereof. In another example, the first sensing insulating layer TINS1 may be formed of an organic layer such as acryl resin, epoxy resin, phenolic resin, polyamide resin, polyimide resin and the like, or a combination thereof.

The driving electrodes TE and the sensing electrodes RE may be disposed on the first sensing insulating layer TINS1. The driving electrodes TE and the sensing electrodes RE may be formed to have, e.g., a stacked structure (Ti/Al/Ti) of aluminum (Al) and titanium (Ti), a stacked structure (ITO/Al/ITO) of Al and ITO, an APC alloy, or a stacked structure (ITO/APC/ITO) of an APC alloy and ITO, but are not limited thereto. For example, the driving electrodes TE and the sensing electrodes RE may be formed of a single layer of molybdenum (Mo), titanium (Ti), copper (Cu), aluminum (Al), or ITO, or a combination thereof. The driving electrodes TE and the sensing electrodes RE may be formed of a same material on a same layer.

First contact holes CNT1 may be disposed in the first sensing insulating layer TINS1 to expose the connection parts BE1 through the first sensing insulating layer TINS1. The driving electrodes TE may be electrically connected to the connection parts BE1 through the first contact holes CNT1.

A second sensing insulating layer TINS2 may be disposed on the driving electrodes TE and the sensing electrodes RE. The second sensing insulating layer TINS2 may serve to planarize a level difference caused by the driving electrodes TE, the sensing electrodes RE, and the connection parts BE1. The second sensing insulating layer TINS2 may include an organic layer such as acryl resin, epoxy resin, phenolic resin, polyamide resin, polyimide resin and the like, or a combination thereof.

The connection parts BE1 electrically connecting the adjacent driving electrodes TE may be disposed on the second buffer layer BF2, and the driving electrodes TE and the sensing electrodes RE may be disposed on the first sensing insulating layer TINS1. Therefore, the driving electrodes TE and the sensing electrodes RE may be electrically isolated at their intersections, the sensing electrodes RE may be electrically connected in a direction, and the driving electrodes TE may be electrically connected in another intersecting direction.

The first transistor T1 may be a photo transistor according to the above-described embodiments. The photo transistor can sense light by absorbing incident light. To this end, a transmissive region TR through which light can be transmitted may be provided on the substrate 110, and the first transistor T1 may be disposed to overlap the transmissive region TR. The transmissive region TR may overlap transparent layers through which light can be transmitted, and layers from which light can be reflected may not be disposed in the transmissive region TR. For example, the first transistor T1 may not overlap the first electrode 171 of the light emitting element layer EML, and may not overlap the electrodes RE and TE and the connection part BE1 of the touch sensor SENL.

In an embodiment, by providing the photo transistor in the pixel of the organic light emitting display device, since it may be not necessary to provide a separate photo transistor outside the display device (e.g., in a bezel), the bezel can be reduced.

Hereinafter, light absorption characteristics of the photo transistor according to the above-described embodiments will be described. In the following description, a photo transistor according to the embodiment shown in FIG. 2 will be described as an example ("embodiment"), and a photo transistor having a structure in which the second active layer may be omitted from the structure of FIG. 2 will be described as a comparative example ("comparative embodiment").

Example

A photo transistor according to the embodiment shown in FIG. 2 described above was manufactured. The first active layer was formed as a single layer of IGZO with a thickness of about 150 nm, and the second active layer was formed as a single layer of selenium with a thickness of about 150 nm.

Comparative Example

A photo transistor was manufactured under the same conditions as in the above-described embodiment without having the second active layer.

A drain current according to a gate voltage was measured in a state in which red light and green light with various intensities were respectively irradiated to the photo transistors manufactured according to the above-described Example and Comparative Example.

Figure 13:
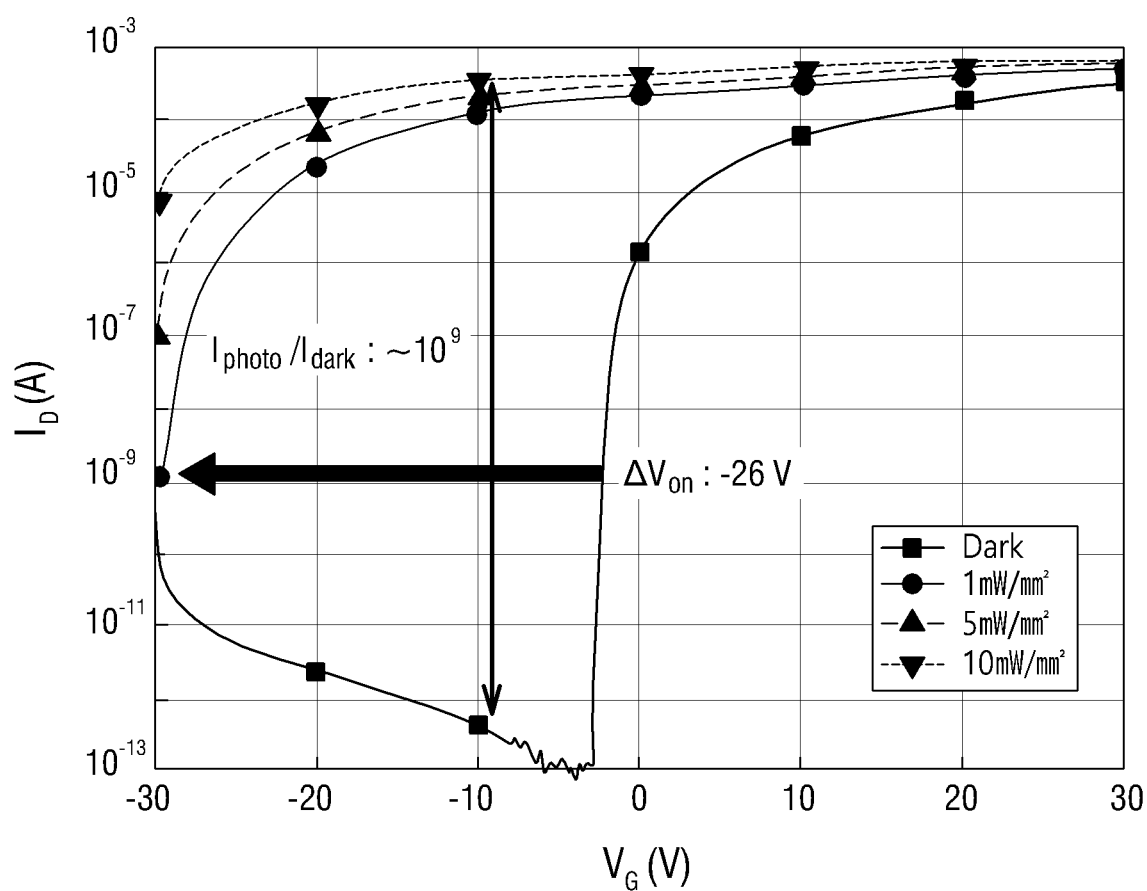
FIG. 13 is a schematic graph obtained by measuring a drain current according to a gate voltage in a photo transistor according to an embodiment.
Figure 14:
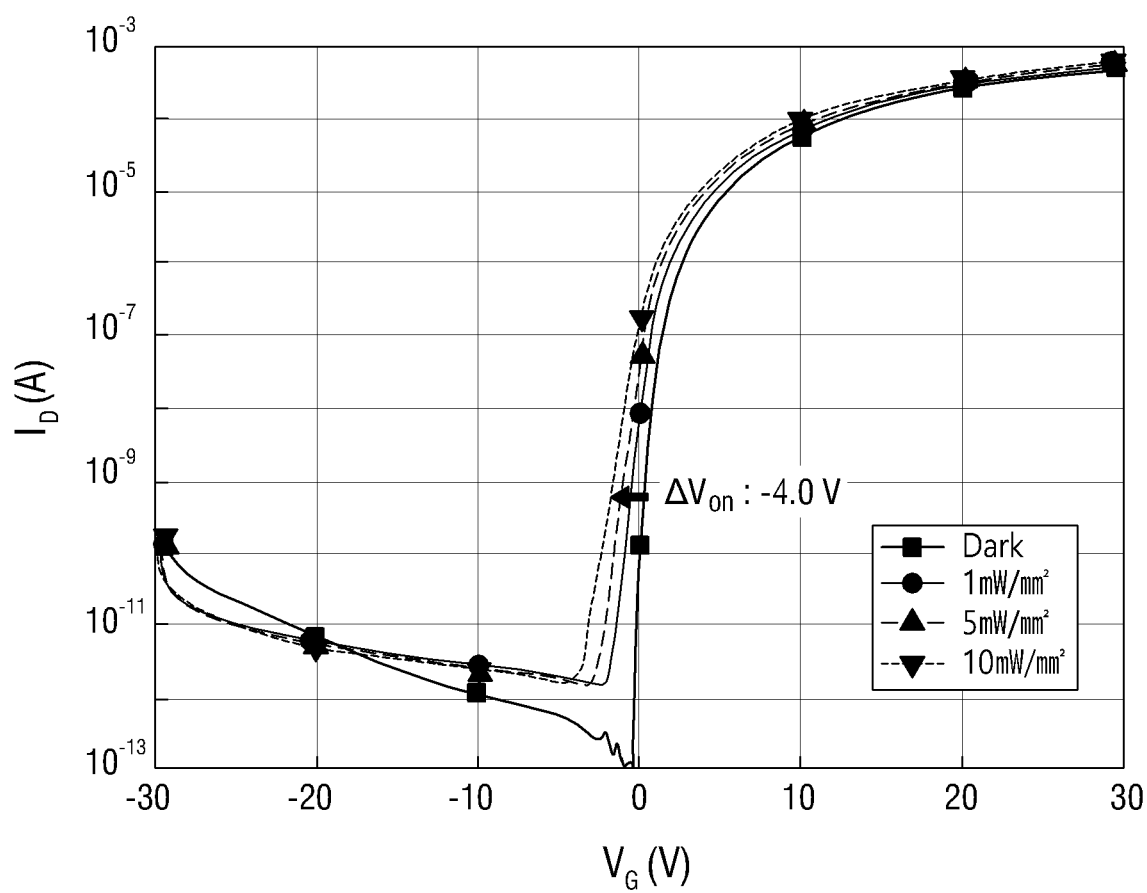
FIG. 14 is a schematic graph obtained by measuring a drain current according to a gate voltage in a photo transistor according to an embodiment.

FIG. 13 is a schematic graph obtained by measuring a drain current according to a gate voltage after irradiating green light to a photo transistor according to an embodiment. FIG. 14 is a schematic graph obtained by measuring a drain current according to a gate voltage after irradiating red light to a photo transistor according to a comparative embodiment. Here, light having a wavelength of about 532 nm and energy of about 2.33 eV was used as the green light.

Referring to FIG. 13, in case that red light was not irradiated to the photo transistor according to the embodiment, a change of the drain current according to the gate voltage was hardly seen. In case that green light with intensities of about 1 mW/mm$^2$, about 5 mW/mm$^2$ and about 10 mW/mm$^2$ was irradiated to the photo transistor according to the embodiment, it was exhibited that the drain current according to the gate voltage gradually increases. It exhibited approximately $10^9$ times difference in drain current in case that green light was not irradiated and in case that green light was irradiated at an intensity of about 10 mW/mm$^2$ at a gate voltage of about −10V. Further, a gate-on voltage variation in case that green light was not irradiated and green light was irradiated was about 26 V. In case that green light was irradiated to the photo transistor of the embodiment, a threshold voltage moved in a negative direction, and an off current greatly increased.

On the other hand, referring to FIG. 14, in case that green light was not irradiated to the photo transistor according to the comparative embodiment, a change of the drain current according to the gate voltage was hardly seen. In case that green light with intensities of about 1 mW/mm$^2$, about 5 mW/mm$^2$ and about 10 mW/mm$^2$ was irradiated to the photo transistor according to the comparative embodiment, it was exhibited that the drain current according to the gate voltage slightly increases. Further, a gate-on voltage variation in case that green light was not irradiated and green light was irradiated was about 4 V. In case that green light was irradiated to the photo transistor of the comparative embodiment, a threshold voltage slightly moved in the negative direction, and the off current did not change.

The photoresponsibity, photosensitivity and detectivity, which may be characteristics of the photo transistors according to the embodiment and the comparative embodiment, for green light, were measured and represented in Table 1 below.

TABLE 1

| | Photoresponsibity (A/W) | Photosensitivity | Detectivity (jones) |
|---|---|---|---|
| Example | 1649.17 | $7.76 \times 10^9$ | $5.86 \times 10^{13}$ |
| Comparative Example | 131.11 | $6.10 \times 10^4$ | $1.14 \times 10^9$ |

Referring to Table 1, it can be seen that the photo transistor according to the embodiment has significantly higher values in photoresponsibity, photosensitivity and detectivity than the photo transistor according to the comparative embodiment.

Accordingly, it can be seen that the photo transistor according to the embodiment having the first active layer and the second active layer absorbs green light to operate as a transistor, but the photo transistor according to the comparative embodiment hardly absorbs green light and thus cannot operate as a transistor.

Figure 15:
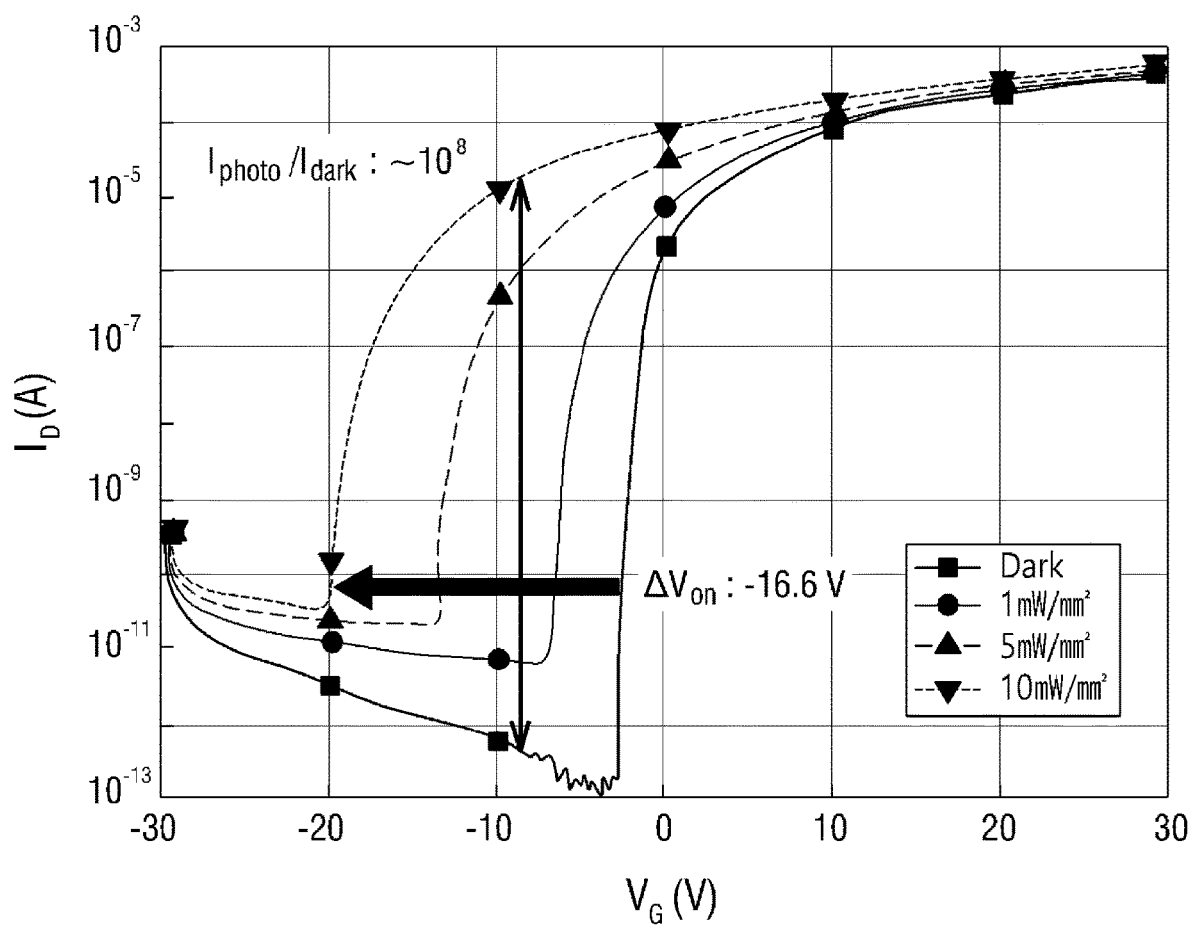
FIG. 15 is a schematic graph obtained by measuring a drain current according to a gate voltage in a photo transistor according to an embodiment.
Figure 16:
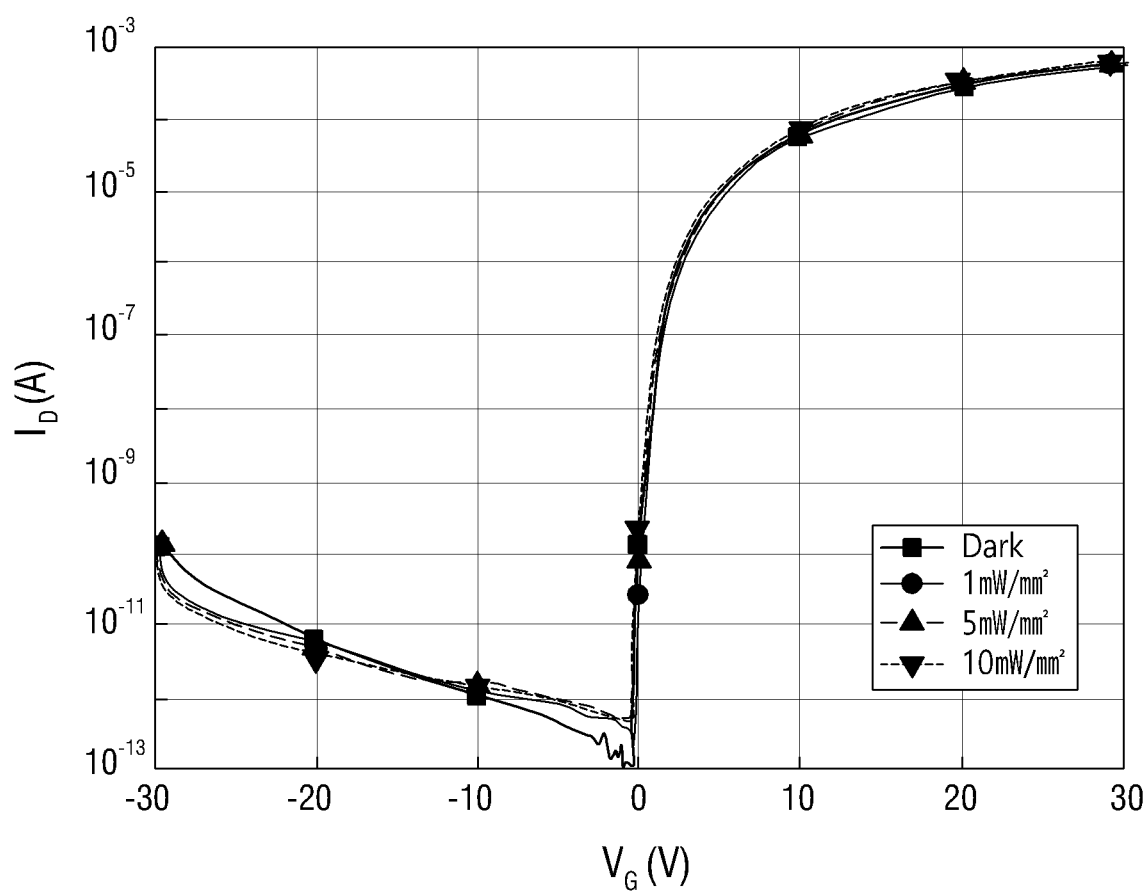
FIG. 16 is a schematic graph obtained by measuring a drain current according to a gate voltage in a photo transistor according to an embodiment.

FIG. 15 is a schematic graph obtained by measuring a drain current according to a gate voltage after irradiating red light to a photo transistor according to the embodiment. FIG. 16 is a schematic graph obtained by measuring a drain current according to a gate voltage after irradiating red light to a photo transistor according to the comparative embodiment. Here, light having a wavelength of 635 nm and energy of 1.95 eV was used as the red light.

Referring to FIG. 15, in case that red light was not irradiated to the photo transistor according to the embodiment, a change of the drain current according to the gate voltage was hardly seen. In case that red light with intensities of about 1 mW/mm$^2$, about 5 mW/mm$^2$ and about 10 mW/mm$^2$ was irradiated to the photo transistor according to the embodiment, it was exhibited that the drain current according to the gate voltage gradually increases. It exhibited approximately 10$^8$ times difference in drain current in case that red light was not irradiated and in case that red light was irradiated at an intensity of about 10 mW/mm$^2$ at a gate voltage of about −10V. Further, a gate-on voltage variation in case that red light was not irradiated and red light was irradiated was about 16.6 V. In case that red light was irradiated to the photo transistor of the embodiment, a threshold voltage moved in the negative direction.

On the other hand, referring to FIG. 16, in case that red light was not irradiated to the photo transistor according to the comparative embodiment, a change of the drain current according to the gate voltage was hardly seen. In case that red light with intensities of about 1 mW/mm$^2$, about 5 mW/mm$^2$ and about 10 mW/mm$^2$ was irradiated to the photo transistor according to the comparative embodiment, it was exhibited that the drain current according to the gate voltage slightly increases. Further, a gate-on voltage variation in case that red light was not irradiated and red light was irradiated did not appear. Even in case that red light was irradiated to the photo transistor of the comparative embodiment, there was no change in the threshold voltage or off current.

The photoresponsibity, photosensitivity and detectivity, which may be characteristics of the photo transistors according to embodiment and comparative embodiment, for red light, were measured and represented in Table 2 below.

TABLE 2

| | Photoresponsibity (A/W) | Photosensitivity | Detectivity (jones) |
|---|---|---|---|
| Example | 303.12 | 6.86 × 10$^8$ | 5.18 × 10$^{12}$ |
| Comparative Example | 83.28 | 1.57 × 10$^2$ | 4.03 × 10$^7$ |

Referring to Table 1, it can be seen that the photo transistor according to the embodiment has significantly higher values in photoresponsibity, photosensitivity and detectivity than the photo transistor according to the comparative embodiment.

Accordingly, it can be seen that the photo transistor according to the embodiment having the first active layer and the second active layer absorbs red light to operate as a transistor, but the photo transistor according to the comparative embodiment does not absorb red light and thus cannot operate as a transistor.

As described with respect to the light absorption characteristics of the photo transistors according to the embodiment and the comparative embodiment shown in FIGS. 13 to 16, the photo transistor according to the comparative embodiment including only the first active layer of IGZO did not absorb red light. On the other hand, the photo transistor according to Example including the second active layer of selenium in addition to the first active layer of IGZO absorbed green and red light. Therefore, in the photo transistor according to the embodiment, the second active layer of selenium provided to supplement the first active layer of IGZO absorbs green and red light, thereby absorbing light (e.g., all light) in the visible wavelength band and thus improving the characteristics of the optical sensor.

Figure 17:
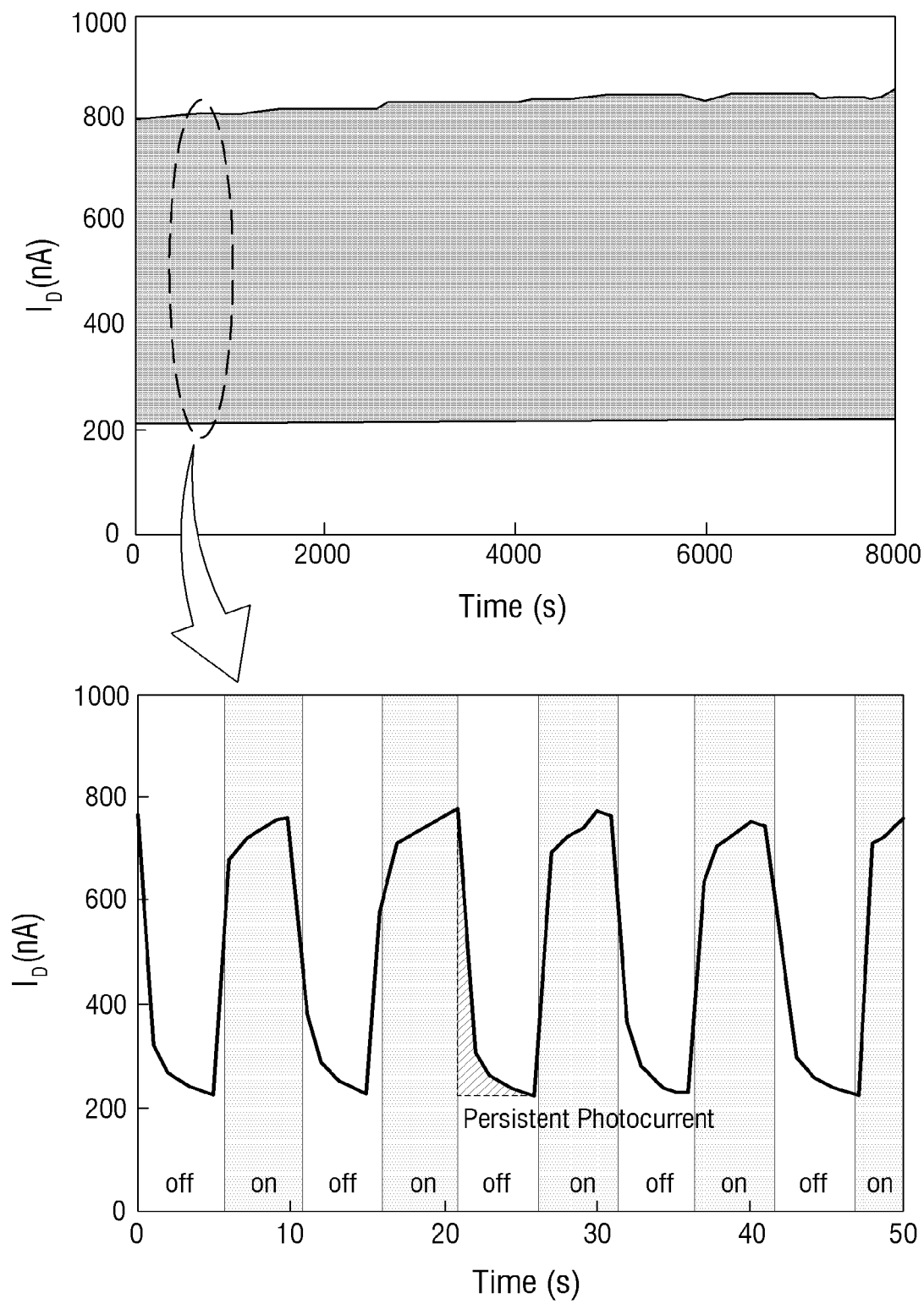
FIG. 17 is a schematic graph obtained by measuring a drain current over time in a photo transistor according to an embodiment.

FIG. 17 is a schematic graph obtained by measuring a drain current over time in case of driving the photo transistor according to the embodiment. Here, the photo transistor was driven to turn on/off the gate every 10 seconds in a state in which constant visible light was irradiated.

Referring to FIG. 17, in the photo transistor according to the embodiment, the drain current value was kept constant in case that the gate may be turned on. Further, a persistent photocurrent (PPC), which may be a drain current that occurs between off and on of the gate, was exhibited. The photo transistor including the single active layer of IGZO of the above-described comparative embodiment is known to have a very large amount of persistent photocurrent (hatched area on the graph), but the photo transistor of embodiment exhibited a small amount of persistent photocurrent.

As a result, it can be seen that the photo transistor according to the embodiment maintains a constant drain current value, has a small amount of persistent photocurrent, and thus has excellent characteristics as a photo transistor.

As described above, the photo transistor according to the embodiment may include a second active layer including selenium in addition to the first active layer including metal oxide, thereby absorbing light (e.g., all light) in the visible wavelength band. Thus, it may be possible to improve light sensing characteristics. Further, it may be possible to improve the photoresponsibity, photosensitivity and detectivity of the photo transistor. The display device according to the embodiment includes a photo transistor having excellent characteristics, thereby improving the light sensing characteristics of the display device.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A photo transistor comprising:
   a gate electrode disposed on a substrate;
   a gate insulating layer that electrically insulates the gate electrode;
   a first active layer overlapping the gate electrode and including metal oxide, the gate insulating layer being disposed between the gate electrode and the first active layer;
   a second active layer disposed on the first active layer and including selenium; and
   a source electrode and a drain electrode respectively electrically connected to the second active layer, wherein
   the first active layer is formed of IGZO, and
   the second active layer is formed of only selenium.

2. The photo transistor of claim 1, wherein the first active layer and the second active layer are in contact with each other in a region in which the first active layer and the second active layer overlap the gate electrode.

3. The photo transistor of claim 2, wherein the first active layer is disposed closer to the gate electrode than the second active layer.

4. The photo transistor of claim 1, wherein
   the source electrode covers a portion of the second active layer, and
   the drain electrode covers another portion of the second active layer.

5. The photo transistor of claim 4, wherein a side edge of the first active layer and a side edge of the second active layer are in contact with each other and aligned with each other.

6. The photo transistor of claim 1, wherein the source electrode and the drain electrode are disposed between the first active layer and the second active layer.

7. The photo transistor of claim 1, wherein the second active layer has a thickness of about 5 nm to about 300 nm.

8. A display device comprising:
 a substrate including a transmissive region and a light emission region;
 a transistor layer disposed on the substrate and including a first transistor and a second transistor, the first transistor including:
  a gate electrode;
  a first active layer including metal oxide;
  a second active layer including selenium; and
  source and drain electrodes;
 a light emitting element layer disposed on the transistor layer and including a first electrode; and
 a touch sensor disposed on the light emitting element layer and including electrodes, wherein
 the first active layer is formed of IGZO, and
 the second active layer is formed of only selenium.

9. The display device of claim 8, wherein
 the first transistor overlaps the transmissive region of the substrate, and
 the second transistor overlaps the light emission region of the substrate.

10. The display device of claim 9, wherein the first transistor does not overlap the first electrode of the light emitting element layer and does not overlap the electrodes of the touch sensor.

11. The display device of claim 10, wherein the second transistor overlaps the first electrode of the light emitting element layer and does not overlap the electrodes of the touch sensor.

12. The display device of claim 8, wherein the light emitting element layer further includes:
 a second electrode facing the first electrode; and
 an organic light emitting layer disposed between the first electrode and the second electrode,
 wherein the first transistor and the second transistor overlap the second electrode.

13. The display device of claim 8, further comprising:
 a thin film encapsulation layer disposed between the light emitting element layer and the touch sensor.

14. The display device of claim 8, wherein the electrodes of the touch sensor include driving electrodes and sensing electrodes.

15. The display device of claim 8, wherein the first active layer and the second active layer are in contact with each other in a region in which the first active layer and the second active layer overlap the gate electrode.

16. The display device of claim 15, wherein the first active layer is disposed closer to the gate electrode than the second active layer.

* * * * *